(12) United States Patent  
Sano

(10) Patent No.: US 7,605,661 B2
(45) Date of Patent: Oct. 20, 2009

(54) PHASE LOCKED LOOP CIRCUIT INCLUDING DIGITAL VOLTAGE-CONTROLLED OSCILLATOR, RING OSCILLATOR AND SELECTOR

(75) Inventor: Masaki Sano, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 60 days.

(21) Appl. No.: 12/068,813

(22) Filed: Feb. 12, 2008

(65) Prior Publication Data

US 2008/0211589 A1 Sep. 4, 2008

(30) Foreign Application Priority Data

Feb. 19, 2007 (JP) ............................. 2007-038323

(51) Int. Cl.
*H03L 7/099* (2006.01)
(52) U.S. Cl. ..................... 331/1 A; 331/45; 331/57; 331/179
(58) Field of Classification Search ............... 331/1 A, 331/17, 18, 25, 45, 46, 55, 57, 179
See application file for complete search history.

(56) References Cited

U.S. PATENT DOCUMENTS 7,424,081 B2 * 9/2008 Suzuki ..................... 375/371

FOREIGN PATENT DOCUMENTS

| JP | 2001-510955 | 8/2001 |
|----|-------------|--------|
| JP | 2002-100965 | 4/2002 |
| JP | 2005-191831 | 7/2005 |

* cited by examiner

*Primary Examiner*—David Mis
(74) *Attorney, Agent, or Firm*—McGinn IP Law Group, PLLC

(57) ABSTRACT

A PLL circuit includes a polyphase reference clock output circuit, which outputs multiple reference clocks, each clock being of different phase. The PLL circuit further includes a digital voltage controlled oscillator, which, using any one of the multiple reference clocks chosen as an operating clock, outputs an output clock whose frequency varies according to a value of a frequency control signal, and which outputs a delay amount data representing a phase difference between the phase of the output clock and an ideal phase gained by computing based on the value of the frequency control signal. The PLL circuit further includes a selection circuit which is responsive to the delay amount data to select and output the output clock synchronized with one of the multiple reference clocks.

10 Claims, 7 Drawing Sheets

PHASE LOCKED LOOP CIRCUIT INCLUDING DIGITAL VOLTAGE-CONTROLLED OSCILLATOR, RING OSCILLATOR AND SELECTOR

BACKGROUND OF THE INVENTION

1. Field of the Invention

This invention relates to a PLL (Phase Locked Loop) circuit and, in particular, to the PLL circuit that enables adjustment of frequency of the signals outputted corresponding to external signals and at the same time permits output of a high-accuracy clock having high phase accuracy in reference to an ideal clock.

2. Description of Related Art

In recent years, an optical disk device which can record or reproduce data in or from CDs, DVDs, and other optical disks has become popular. The optical disk media have wobble with a certain cycle engraved in the grooves formed on the disk surface. In the optical disk device, the wobble signal created on the basis of this wobble is given to the PLL circuit to generate a synchronous clock signal used at the time of recording and reproduction. For this purpose, the optical disk device is mounted with the PLL circuit which varies the frequency of the clock in accordance with the wobble. In order to carry out recording or reproducing of data in or from the optical disks with accuracy, the PLL circuit mounted on the optical disk device is required to ensure high phase accuracy in generating a clock signal synchronized with the clock signal of originating synchronous source determined by the wobble signal.

Examples of the PLL circuit that creates a clock signal synchronized with the reference signal with a high accuracy are disclosed in the patent document 1 and 2 (to be referred to hereafter as "the Patent Document 1" and "the Patent Document 2" respectively). The PLL circuits disclosed in the Patent Document 1 and the Patent Document 2 are able to create a clock synchronized with the reference signal with a high accuracy, but cannot alter the range of frequency variance of the clock signal to be created. In the case of the optical disk media, there is a large difference in distance between the inner circumferences, and the outer circumferences, and therefore, between reading in the inner circumference side and reading in the outer circumference side, the frequency of the wobble signal is varied more than twice between the inner side and the outer side. For this reason, the PLL circuit mounted on the optical device needs to vary the frequency of the clock signal to be created over a range twice as wide from the low side to the high side according to the wobble signal. Accordingly, the PLL circuits disclosed in the Patent Document 1 and the Patent Document 2 have a problem in that these circuits cannot be used for the purpose that requires such a wide-ranged frequency variance.

Contrary to the above, the PLL circuit disclosed in the patent document 3 (to be referred to hereafter as "the Patent Document 3" ) is able to create a high-accuracy clock synchronized with the reference clock with sufficient accuracy, while varying the frequency of the clock signal created according to the value of the frequency control input to be given from the external source. Shown in FIG. 7 is a block diagram of the PLL circuit 100 disclosed in the Patent Document 3. As shown in FIG. 7, the PLL circuit 100 includes the digital VCO 101 and the delay line 102. The digital VCO 101 performs control of the frequency of the output clock in accordance with the frequency control input and outputting of the data (e.g., delay amount data) about phase difference from the reference signal, the originating synchronous source for the output clock. The delay line 102 outputs the high-accuracy clock by delaying the rising edge of the output clock in accordance with the data of delay amount.

[Patent Document 1] Japanese Patent Laid-Open Application No. 2001-510955

[Patent Document 2] Japanese Patent Laid-Open Application No. 2002-100965

[Patent Document 3] Japanese Patent Laid-Open Application No. 2005-191831

The Patent Document 3 uses the DLL (Delay-Locked Loop) for the delay line 102. Generally this DLL is large in circuit scale and power consumption. Due to such features, a semiconductor device mounted with the PLL circuit 100 of the Patent Document 3 has problems in that the chip size becomes large and the power consumption of the device also increases.

SUMMARY OF THE INVENTION

A PLL circuit includes a polyphase reference clock output circuit, which outputs multiple reference clocks, each clock being of different phase. The PLL circuit further comprises a digital voltage controlled oscillator, which, using any one of said multiple reference clocks chosen as an operating clock, outputs an output clock whose frequency varies according to a value of a frequency control signal, and which outputs a delay amount data representing a phase difference between the phase of said output clock and an ideal phase gained by computing based on the value of the frequency control signal. The PLL circuit further includes a selection circuit which is responsive to the delay amount data to select and output the output clock synchronized with one of the multiple reference clocks.

Having the above configuration, the PLL circuit is able to output a high-accuracy clock which can set phase in more minute steps than the frequency variation steps which the digital VCO can afford. In other words, the PLL circuit relating to the present invention is able to create a high-accuracy clock synchronized with a clock signal, achieving synchronization in high-resolution steps, without providing a delay circuit such as DLL, but with a simplified circuit configuration.

According to the PLL circuit relating to the present invention, it is possible to output a high-accuracy clock having high phase accuracy in relation to the clock signal to be outputted, while realizing small circuit scale and low power consumption.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENT

Embodiment 1

Figure 1:
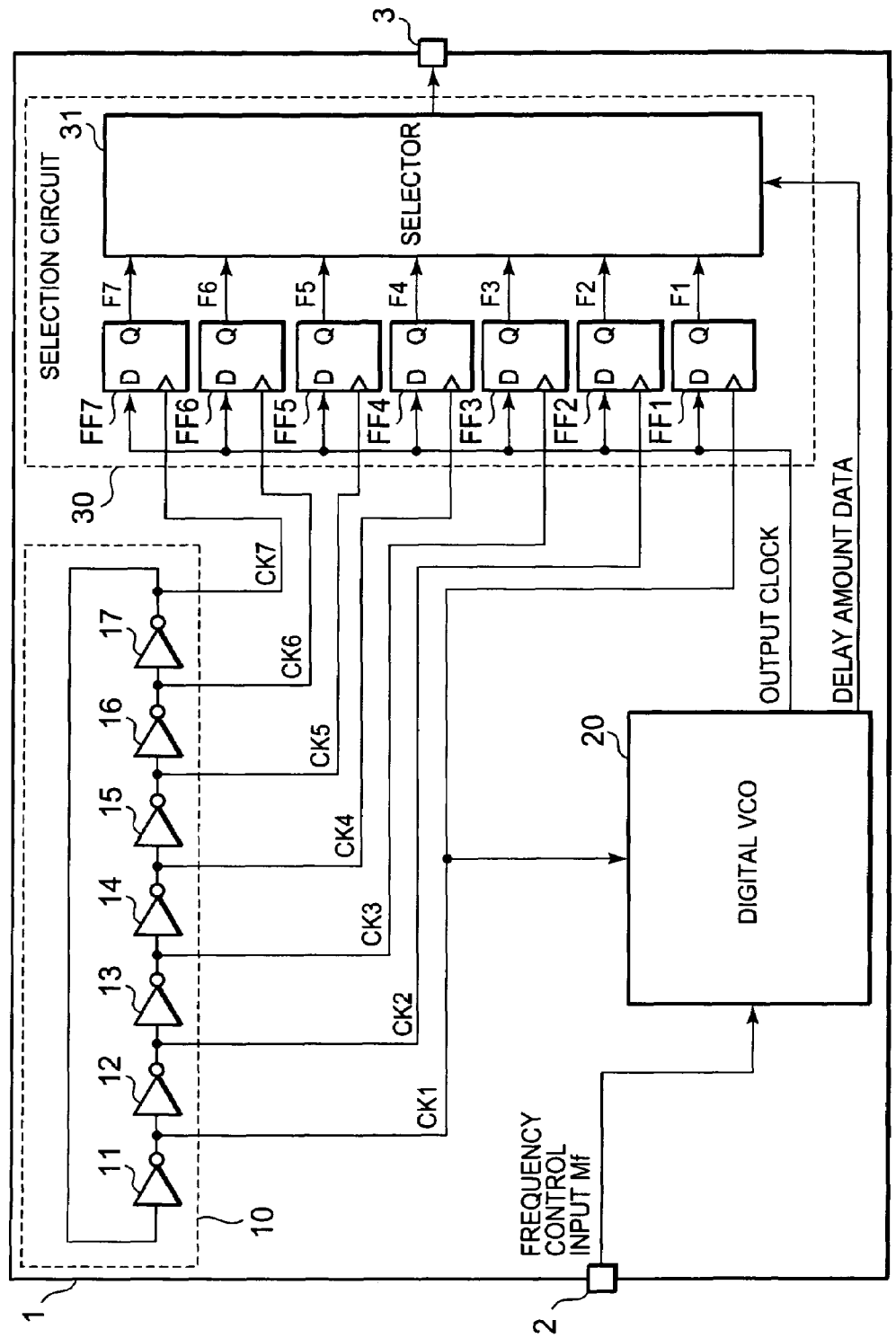
FIG. 1 is a block diagram of the PLL circuit relating to the embodiment 1.

FIG. 1 shows a block diagram of the PLL circuit 1 relating to Embodiment 1. As shown in FIG. 1, the PLL circuit 1 includes the frequency control terminal 2, the high-accuracy clock output terminal 3, the polyphase reference clock output circuit 10, the digital VCO 20, and the selection circuit 30.

The frequency control terminal 2 is an input terminal for the frequency control input Mf which is to set the frequency of the output clock outputted from the digital VCO 20. The high-accuracy clock output terminal 3 is the output terminal for the PLL circuit 1. The polyphase reference clock output circuit 10 has odd number of inverters (the inverters 11-17 in the present embodiment). The inverters 11-17 are respectively connected in series, and the output from the inverter 17 in the last stage is connected to the input of the inverter 11 in the first stage. The outputs from the inverters 11-17 are denoted as the polyphase reference clock CK1 to CK7 and provided to the selection circuit 30.

The digital VCO 20 functions using any one of the reference clock CK1 to CK7 as the operating clock. Therefore, it is preferable that the frequency of the reference clock should be set at a frequency higher than the highest frequency of the output clock outputted from the digital VCO 20. In the present embodiment, it is assumed that the reference clock CK1 is used for the operating clock. The digital VCO 20 outputs the output clock whose frequency varies corresponding to the value of the frequency control input Mf, and the delay amount data representing the phase difference between the phase of the ideal clock computed corresponding to the value of the frequency control input Mf and the phase of the output clock. The digital VCO 20 will be explained about in more detail afterward. By the way, the ideal clock means the clock which, as the originating synchronous source, is to synchronize the rising edge of the high-accuracy clock outputted from the PLL circuit. The phase of this ideal clock is called as the "ideal phase" hereinbelow.

The selection circuit 30 includes a plurality of latch circuits and the selector 31. For the plurality of latch circuits in embodiments, the same number of the D-type flip-flop circuits (a bistable circuit) (FF1 to FF7 in the drawing) as the number of the reference clocks are used. The D-type flip-flop circuits FF1 to FF7, at the terminals D, receive the input of the output clock outputted from the digital VCO, and the clock input terminals receive input of the corresponding reference clocks. The D-type flip-flop circuits FF1 to FF7 retain the logical values inputted to the input terminals D when the rising edge of the reference clock is inputted. The retained values are then outputted from the terminals Q as the delayed clocks F1 to F7. The selector 31 selects and outputs any one of the delayed clocks F1 to F7 outputted from the D-type flip-flop circuits FF1 to FF7 corresponding to given delay amount data.

Figure 2:
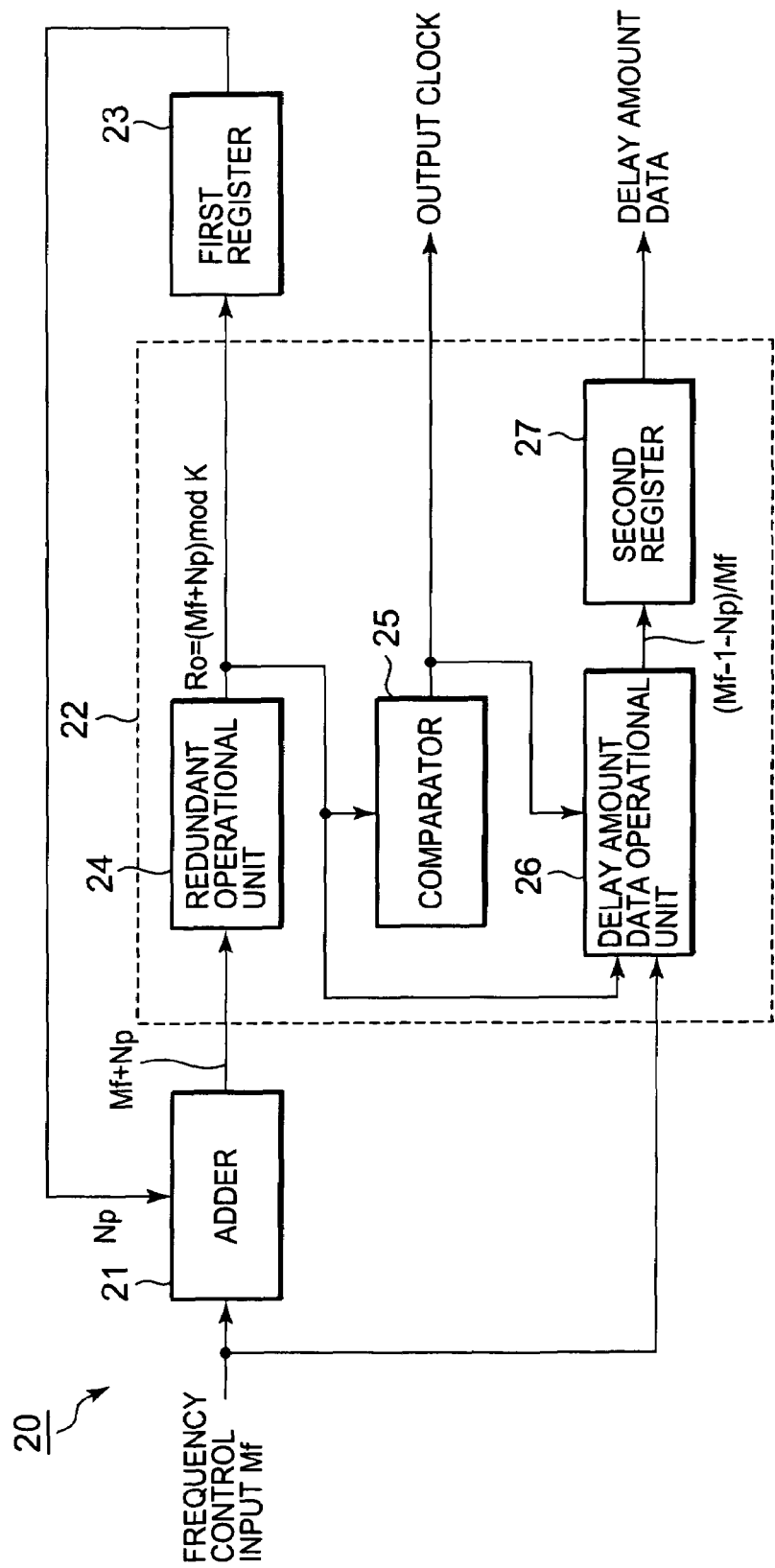
FIG. 2 is a block diagram of the digital VCO relating to the embodiment 1.

Explanation of the digital VCO 20 is given in detail here. FIG. 2 shows a block diagram of the digital VCO 20. As FIG. 2 shows, the digital VCO 20 includes the adder 21, decoder 22, and first register 23. Also, the decoder 22 includes the redundant operational unit 24, comparator 25, delay amount data operational unit 26, and second register 27. The digital VCO 20 functions using the reference clock 1 as the operating clock.

The adder 21 adds the frequency control input Mf and the internal phase data Np together, every time the rising edge of the operating clock is inputted. Based on the computational result at the adder 21 and the frequency control input Mf, the decoder 22 creates the output clock, the delay amount data, and the redundant operation output Ro. The redundant operation output Ro outputted from the decoder 22 is to be stored in the first register 23 to become the internal phase data Np for the next timing.

In the next place, explanation is made of the decoder 22. The redundant operational unit 24 is to divide the value inputted from the adder 21 (Mf+Np) by the maximum value of the internal phase data plus 1 (=K; provided Mf<<K), with the remainder [(Mf+Np) mod K] to be outputted to the comparator 25, the delay amount data operational unit 26, and the first register 23 (the expression here of "A mod B" means the remainder when A is divided by B). The comparator 25 outputs "1" as the output clock in case the value [(Mf+Np) mod K] inputted from the redundant operational unit 24 is less than K/2, and "0" in case larger than K/2. The delay amount data operational unit 26 is to compute the delay amount data based on the ideal phase computed from the redundant operation output Ro and the frequency control input Mf and also the phase of the output clock. The delay amount data is stored in the second register 27 and is to be outputted to the selection circuit 30 at a predetermined timing.

Explanation is now made of the function of the decoder 22. Since the adder 21 and the decoder 22 operate synchronized with the reference clock, the values outputted from these units are renewed at intervals of every unit time equivalent to one cycle of the reference clock. If each unit in the digital VCO 20 repeats operation in cycles of the reference clock, the internal phase data Np is increased by Mf at each cycle of the reference clock. Assuming that the frequency of the reference clock is Fref, the oscillatory frequency F of the output clock outputted from the comparator 25 can be expressed as F=Fref×Mf/K.

If K/Mf is integral number N, F makes a clock of a constant frequency equal to Fref divided by N. However, if K/Mf is not an integral number (in other expression: if K/Mf=N+α, 0<α<1), the output clock will be available in both the clock having cycles of N/Fref and the clock having cycles of (N+1)/Fref mixed together.

The delay amount data operational unit 26 is to compute the difference between the phase of the ideal clock and the phase of a clock by converting the internal phase data Np. More concretely, the delay amount data operational unit 26 performs an arithmetical operation of (Mf−1−Np)/Mf when the rising edge of the output clock is inputted, and the result is outputted to the second register 27.

Figure 3:
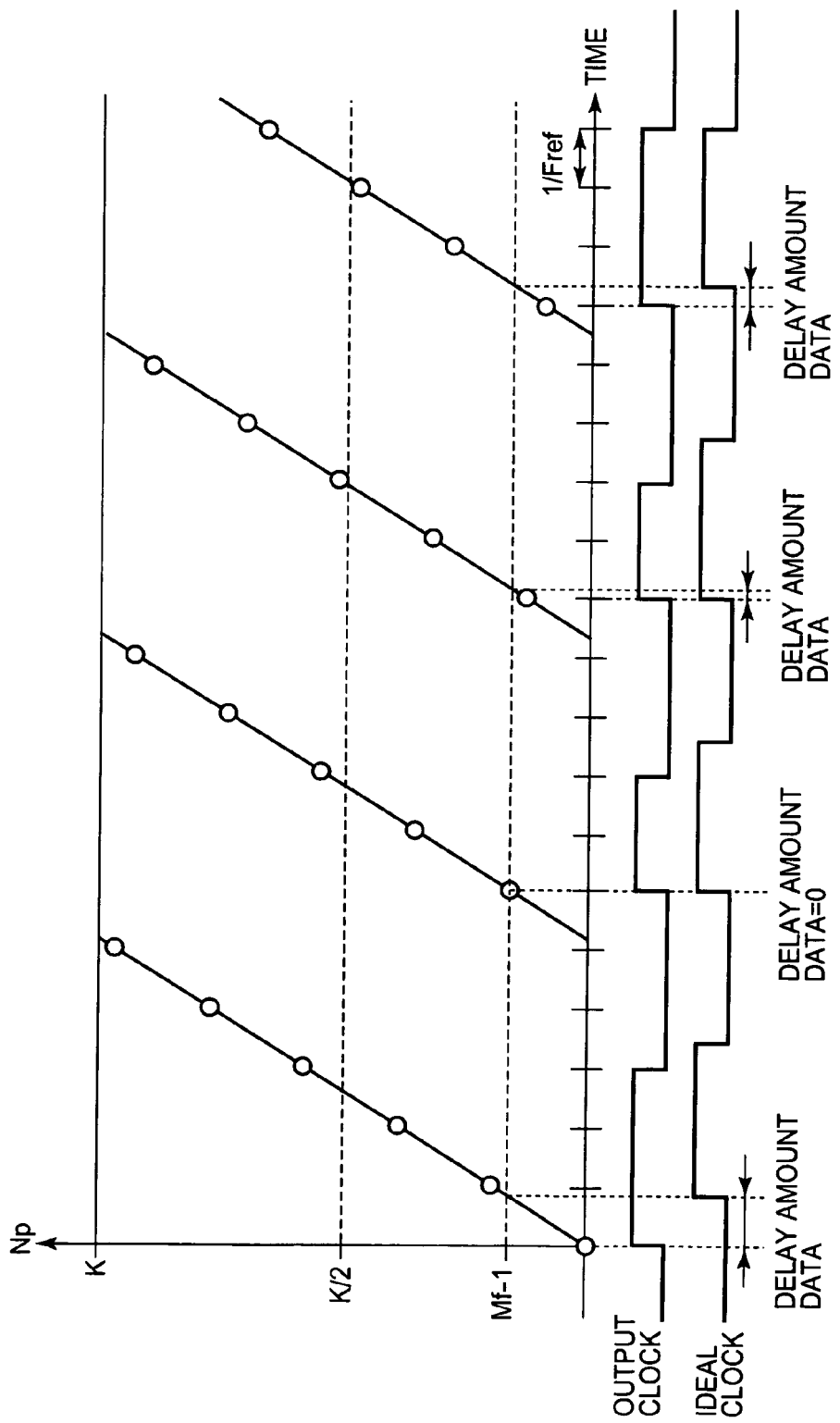
FIG. 3 is a timing chart illustrating the operation of the digital VCO relating to the embodiment 1.

FIG. 3 shows a timing chart illustrating the operation of the decoder 22. As shown in FIG. 3, the vertical axis represents the Np values and the horizontal axis represents time. When the changes of the internal phase data Np are graphed on condition that Mf is constant, Np values are to be plotted in a saw tooth shape. Assuming the timing when the value of Np increases and outreaches a predetermined threshold value (Mf−1), is defined to be the ideal phase, the difference between the value of Np at the time the rising edge of the output clock is outputted and the value of (Mf−1) becomes proportional to the difference between the output timing of the output clock and the ideal phase. In other words, if Mf is constant, then the time until the value Np at the output timing of the output clock (the output timing in the case that the output clock is sent out in the same cycles as the reference clock)runs over M−1, can be calculated by dividing (Mf−1−Np) by Mf.

The delay amount data can be defined by what number of time zone the instant the value of Np has reached M−1 is included in, when time-division is evenly made of one cycle of the reference clock by any natural number of 2 or over. For example, when the delay amount data operational unit 26 divides one cycle of the reference clock (1/Fref) into "m" equal parts to calculate delay amount data, and assuming that the output timing of the output clock is "T" and the timing of the ideal phase is "t" and further that the condition of T<t≦T+1/m·Fref holds, the delay amount data becomes 1. Also, if T+1/m·Fref<t≦T+2/m·Fref holds, the delay amount data becomes 2. Generally, if T+n/Fref<t≦T+(n+1)/Fref holds, the delay amount data becomes n (provided n should be a natural number of m or below.) In the present embodiment, m=7.

The delay amount data operational unit 26 outputs the delay amount data obtained in the above manner to the second register 27. The delay amount data is to be stored temporarily in the second register 27 and then outputted to the selection circuit 30.

Figure 4:
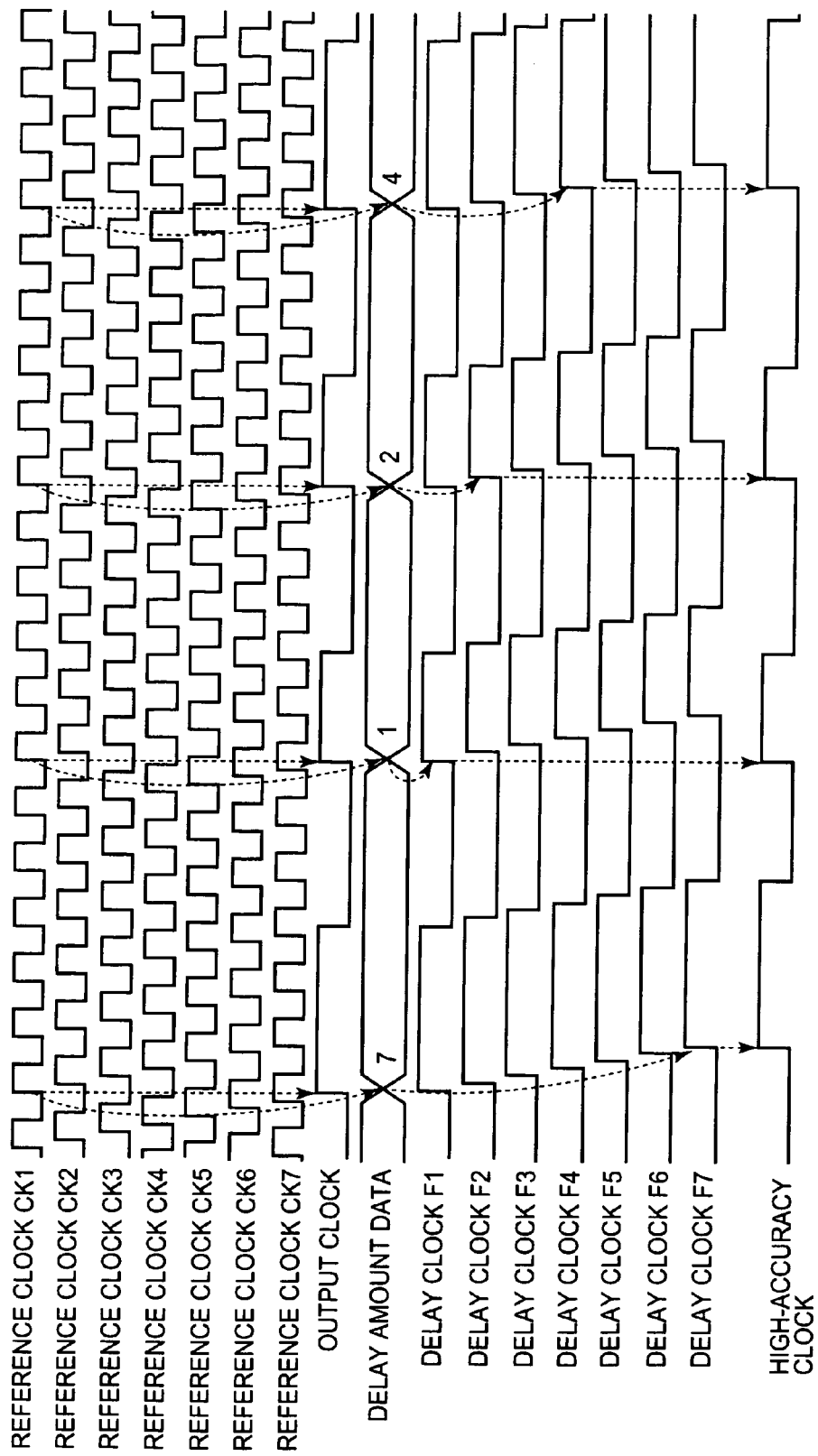
FIG. 4 is a timing chart illustrating the operation of the PLL circuit relating to the embodiment 1.

The PLL circuit 1 according to the present embodiment utilizes the output clock and the delay amount data, both of which are outputted in the above manner, to generate the high-accuracy clock. FIG. 4 shows a timing chart illustrating the operation of the PLL circuit 1. However, please note any signal delay that may occur at the selector 31 is not considered in the example shown in FIG. 4. In the PLL circuit 1 as in FIG. 4, the polyphase reference clock output circuit 10 outputs seven phases of reference clock CK-1 to CK-7. Also, the digital VCO 20 outputs the output clock synchronized with the reference clock CK-1 and the delay amount data whose value varies synchronized with the rising edge of the output clock. And in the selection circuit 30, the delayed clocks F1 to F7 are to be created with the latch to the output clocks provided by the reference clocks inputted corresponding to the D-type flip-flop circuits FF1 to FF7. In other words, the rising edges of the delayed clocks F1 to F7 become seven phases of the output clocks synchronized with the reference clocks CK1 to CK7.

Any one of such delayed clocks F1 to F7 is to be selected by the selector 31. For example, in case the delay amount data indicates 7, the selector 31 is to select and output the delayed clock F7 as the high-accuracy clock. Likewise, if the delay amount data indicates 1, the selector 31 is to select and output the delayed clock F1 as the high-accuracy clock. The value of the delay amount data is to be calculated as a difference from the ideal phase at the digital VCO 20. Also, the delay amount of the delayed clock is to be created on the basis of the delay amount of the reference clock and set up in steps smaller than the phase adjustable range of the output clock. That is to say, the delayed clock selected based on the delay amount data in the selection circuit 30 is done so after its difference from the ideal phase is adjusted in steps smaller than the phase adjustable range of the output clock. In the present embodiment, the clock outputted from the selection 30 is called the high-accuracy clock, because its difference of phase from the ideal clock is small and its phase accuracy is high.

As explained above, the PLL circuit 1 relating to the present embodiment is to generate the polyphase delayed clocks F1 to F7 by latching the output clock with the polyphase reference clocks CK1 to CK7. And, the selector 31 selects any one of the delayed clocks F1 to F7 based on the delayed amount data and outputs it as the high-accuracy clock. In the above manner, it becomes possible for the PLL circuit 1 to adjust the phase of the high-accuracy clocks by means of the phase difference steps of the polyphase reference clocks. In other words, the PLL circuit 1 conducts adjustment of the phase of the high-accuracy clock in steps smaller than the phase adjustable range of the digital VCO 20, thereby permitting the phases of the high-accuracy clock and the ideal clock to be synchronized with each other with a high accuracy.

Further, in the PLL circuit 1, the frequency of the output clock of the digital VCO 20 can be varied widely according to the frequency control input Mf. For example, if the value of the frequency control input Mf is doubled, the speed of increase of the internal phase data Np is also doubled. Accordingly, the frequency of the output clock becomes double.

Further, since the PLL circuit 1 uses the polyphase reference clock, it is possible to make the phase adjustable range of the high-accuracy clock smaller without need to increase the frequency of the reference clock. In short, it is possible to enhance accuracy of the reference clock in relation to the ideal phase while keeping the frequency of the reference clock low and saving power consumption of the PLL circuit 1. Besides, the PLL circuit 1 does not need to use the DLL circuit which requires large circuit area and consumes large power, as the case of the Patent Document 3. For this reason, the PLL circuit 1 can save circuit area and power consumption much more than the PLL circuit 100 in the Patent Document 3. The PLL circuit 1 relating to the present embodiment does not have to go via a delay line, but can output the clock signal outputted from the selection circuit only by operating to choose it. Therefore, the phase difference data based on the delay amount data can be reflected on the high-accuracy clock instantly. Because of all these merits, it is possible for the PLL circuit 1 relating to the present embodiment to shorten the time until to lock the phase of the high-accuracy clock.

The polyphase reference clocks used in the present embodiment are generated by the polyphase reference clock output circuit 10, which, however, does not cause circuit area to increase. This is because both of the reference clock in the Patent Document 3 and the polyphase reference clocks in the present embodiment can be generated basically by the same circuit. For example, the reference clock in the Patent Document 3 is generated by taking out one of the reference clocks generated by an oscillator circuit of multi-stage structure (the polyphase reference clock output circuit 10 in the present embodiment). Comparably, the polyphase reference clocks in the present embodiment are generated by taking out the outputs from every stage of the polyphase reference clock output circuit 10. To sum up the above matter, the polyphase reference clocks in the present embodiment and the reference clock in the Patent Document 3 can be generated by the same circuit, and it is evident that no increase in circuit area is deemed necessary with regard to the polyphase reference clock output circuit 10

Figure 5:
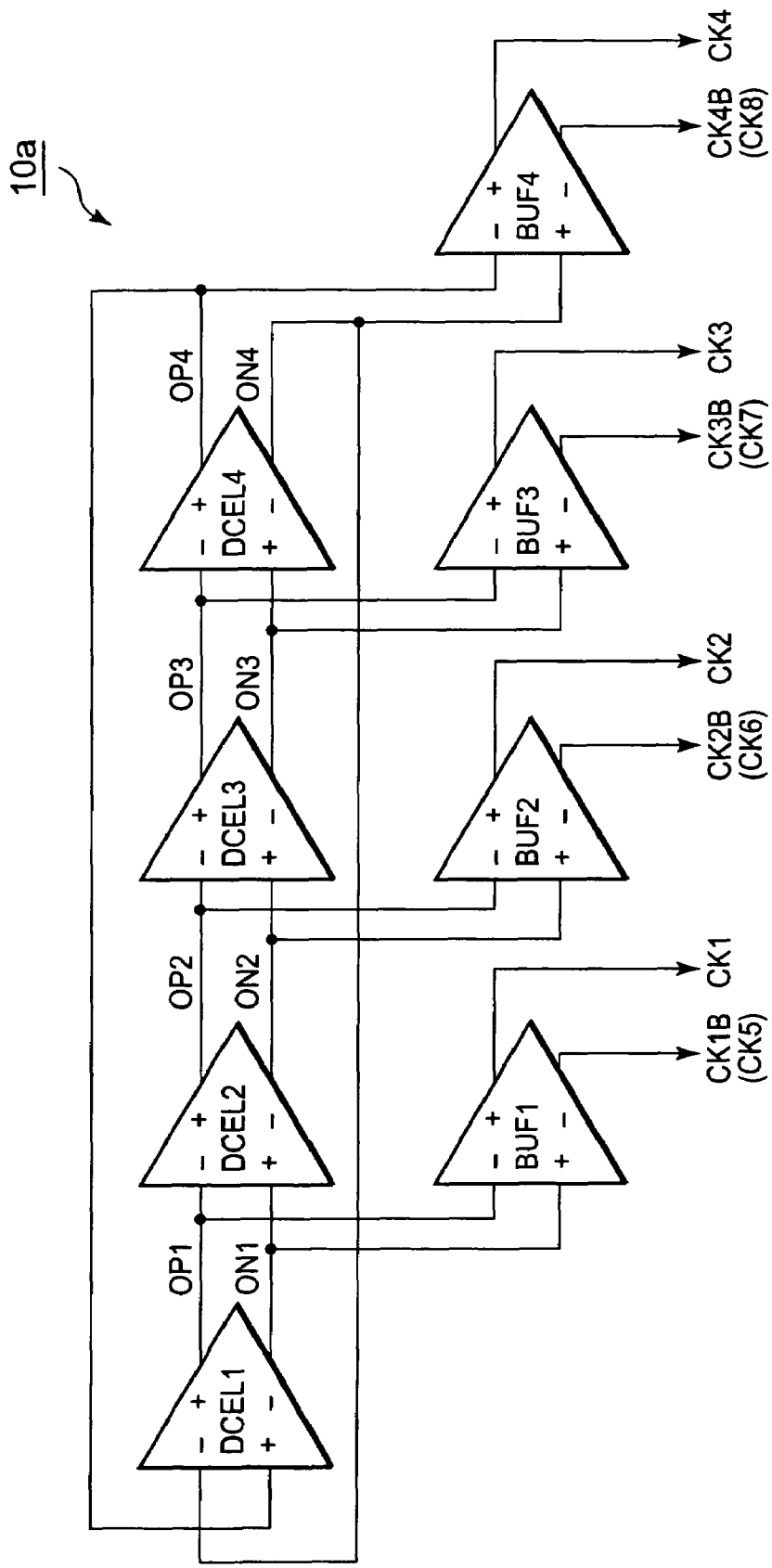
FIG. 5 is a circuit diagram of another example of the polyphase reference clock output circuit relating to the embodiment 1.

In the above embodiment, a circuit configuration including odd number of inverters connected in a ring form is used for the polyphase reference clock output circuit 10, and some other circuit configuration is also adoptable to compose the polyphase reference clock output circuit 10. FIG. 5 shows a circuit diagram of another example of the polyphase reference clock output circuit 10 (such another circuit is to be hereinafter referred to as the polyphase reference clock output circuit 10*a*). As shown in FIG. 5, the polyphase reference clock output circuit 10*a* is formed by connecting the delay cells DCEL1 to DCEL4 for differential input and differential output in a ring form. And, the outputs of the delay cell DCEL1 to DCEL4 are connected to the level conversion buffers BUF1 to BUF4. The level conversion buffers BUF1 to BUF5 are the buffer circuits that function on the differential input and differential output basis, converting the input signal level to a level of signal suitable for the subsequently connecting circuits. The level conversion buffers BUF1 to BUF4 respectively output the polyphase reference clocks CK1 to CK4 from the non-inverting output terminals, and also, from the inverting output terminals, output the reference clocks CK1B to CK4B inverted from the reference clocks CK1 to CK4. In short, the reference clocks CK1 to CK4 and the reference clocks CK1B to CK4B are to make up eight phases of reference clocks CK1 to CK8, having respectively different phases.

Since the polyphase reference clock output circuit 10 uses an odd numbers of inverters connected, the polyphase reference clocks with phase difference set in even steps can be outputted also in the odd numbers. Contrastingly, in the polyphase reference clock output circuit 10a, it is possible to output plural polyphase reference clocks with phase difference set in even steps. Depending on the configuration of system, either the polyphase reference clock output circuit 10 or the polyphase reference clock output circuit 10a may be properly selected so as to enable greater flexibility in modifying the phase differences among polyphase reference clocks.

Embodiment 2

Figure 6:
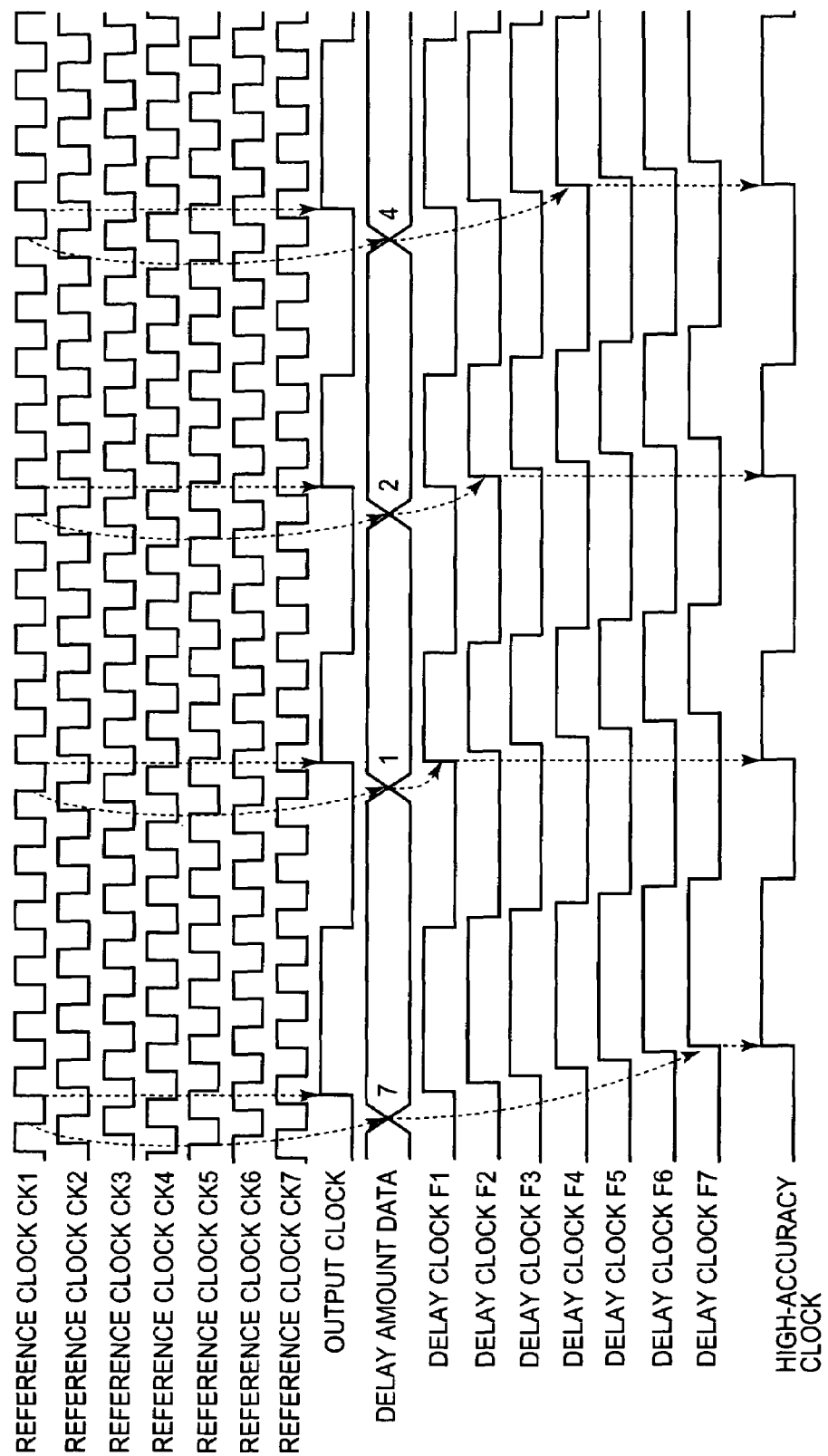
FIG. 6 is a timing chart illustrating the operation of the PLL circuit relating to the embodiment 2.
Figure 7:
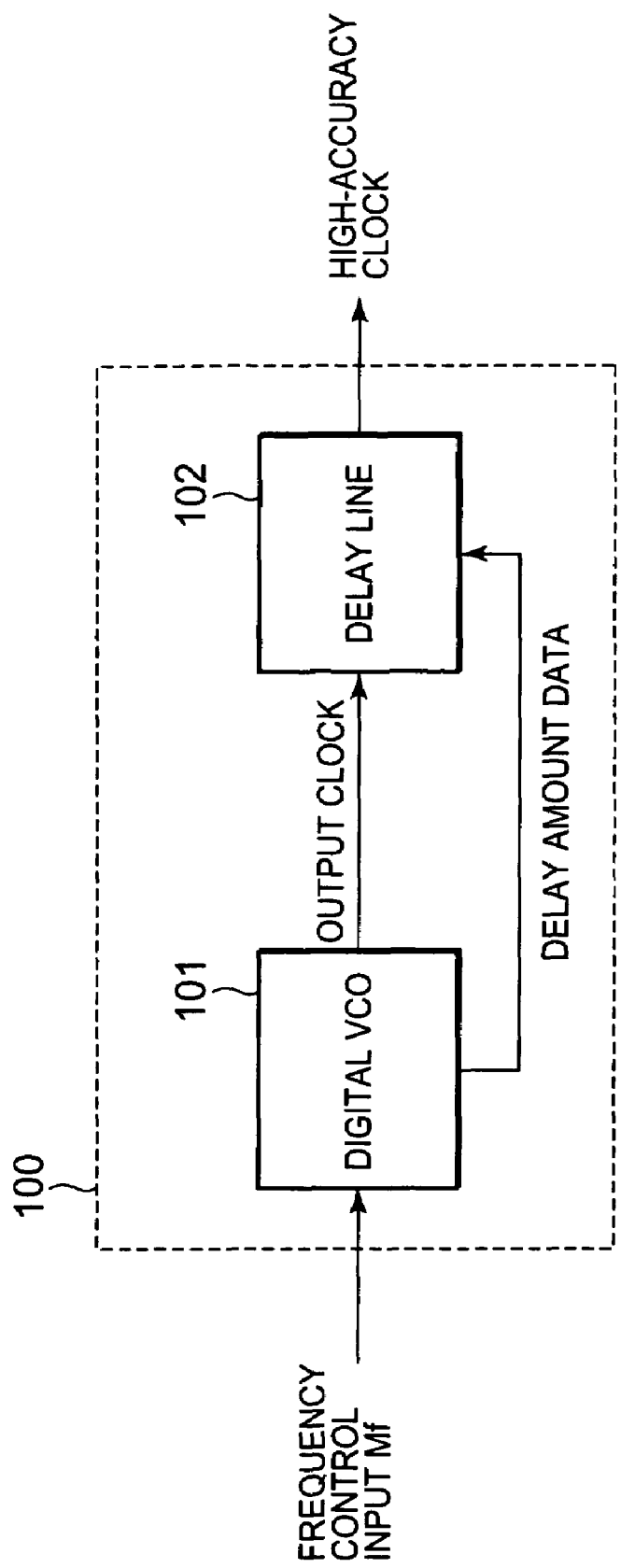
FIG. 7 is a block diagram of the PLL circuit relating to the Patent Document 3.

As to Embodiment 2, explanation is made of the operations of the PLL circuit in the case that there is delay in the selector. The PLL circuit relating to Embodiment 2 is practically of the same circuit configuration as the PLL circuit relating to Embodiment 1. FIG. 6 shows a timing chart illustrating the operations of the PLL circuit relating to Embodiment 2.

As shown in FIG. 6, in Embodiment 2, the delay amount data is outputted synchronized with the falling edge of the reference clock CK1 before the rising edge of the output clock is outputted. By outputting the delay amount data at such timing as mentioned above, the selected delayed clock can be outputted without delay as the high-accuracy clock, even when any delay in change-over might occur at the selector 31. In other words, the PLL circuit 1 can output the high-accuracy clock without regard to the delay amount data in the selector 31 and make it synchronized with the ideal clock more accurately than in Embodiment 1. In the above manner, it is possible for the PLL circuit relating to Embodiment 2 to increase the phase lock speed of the high-accuracy clock more than the case of Embodiment 1.

This invention is not limited to the abovementioned embodiments but any modifications of the embodiments may be made without departing from the spirit and scope of the invention. For example, the number of phases for the reference clock is not limited to seven phases but may be set at much increased number. This makes it possible for the high-accuracy clock to get synchronized with the ideal clock more accurately.

Further, it is noted that, Applicant's intent is to encompass equivalents of all claim elements, even if amended later during prosecution

What is claimed is:

1. A phase locked loop (PLL) circuit, comprising:
a polyphase reference clock output circuit, which outputs multiple reference clocks, each clock being of different phase;
a digital voltage-controlled oscillator (VCO), which, using any one of said multiple reference clocks chosen as an operating clock, outputs an output clock whose frequency varies according to a value of a frequency control signal, and which outputs a delay amount data representing a phase difference between a phase of said output clock and an ideal phase computed based on the value of said frequency control signal; and
a selection circuit, which is responsive to said delay amount data to select and output said output clock synchronized with one of said multiple reference clocks.

2. The PLL circuit according to claim 1, wherein a frequency of said reference clock is higher than the highest frequency of said output clock.

3. The PLL circuit according to claim 1, wherein said selection circuit outputs said output clock, based on phase adjustment steps set corresponding to phase differences between one and another of said multiple reference clocks.

4. The PLL circuit according to claim 1, wherein:
said polyphase reference clock output circuit includes an odd number of inverters connected in series;
an output from an inverter in a last stage is connected to an input of an inverter in a first stage; and
an output from each of said odd number of inverters is outputted respectively as a reference clock.

5. The PLL circuit according to claim 1, wherein:
said polyphase reference clock output circuit comprises a plurality of delay cells connected in series, each of said delay cells including a differential input and a differential output, an output from a last stage is connected to an input of said delay cell in a first stage, and an output from each of said plurality of delay cells is outputted respectively as a reference clock.

6. The PLL circuit according to claim 1, wherein said selection circuit comprises:
a plurality of latch circuits connected to said multiple reference clocks, respectively, said plurality of latch circuits latching said output clock, taking a corresponding one of said reference clocks as a trigger signal; and
a selector which selects and outputs any one of a plurality of delayed clocks outputted from said plurality of latch circuits.

7. The PLL circuit according to claim 6, wherein said selection circuit changes over said delayed clock to one to be selected, at a timing before a logical level of said output clock is changed over.

8. The PLL circuit according to claim 1, wherein said digital VCO outputs said output clock whose frequency becomes higher as said value of said frequency control signal input increases.

9. A phase locked loop circuit, comprising:
a ring oscillator which comprises a plurality of inverters which are connected to form a ring connection, and which outputs a plurality of clock signals with different phase from one another;
a digital voltage-controlled oscillator which is responsive to at least one of said clock signals and a frequency control signal, to output an output clock and a delay amount data; and
a selection circuit comprising:
a plurality of latch circuits, each of which latches said output clock in response to a corresponding one of said plurality of clock signals to output a respective latched output clock; and
a selector which receives the latched output clocks and said delay amount data, and which, based on said delay amount data, selects and outputs one of the latched output clock signals.

10. The PLL circuit according to claim 9, wherein said selection circuit changes the selected and outputted one of the latched output clock signals, at a timing before a logical level of said output clock is changed over.

* * * * *